METHOD FOR PREPARING LITHOGRAPHIC PRINTING PLATE

Filed Oct. 5, 1970

INVENTORS
YOSHITO MUKAIDA
KIKUO KUBOTERA
EIICHE MIZUKI
BY Sughrue, Rothwell, Mion, Zinn & Macpeak
ATTORNEYS United States Patent Office 3,814,603

Patented June 4, 1974

3,814,603

METHOD FOR PREPARING LITHOGRAPHIC PRINTING PLATE

Yoshito Mukaida, Kikuo Kubotera, and Eiiche Mizuki, Asaka, Japan, assignors to Fuji Photo Film Co., Ltd., Minami Ashigara-shi, Kanagawa, Japan Filed Oct. 5, 1970, Ser. No. 77,930

Claims priority, application Japan, Oct. 4, 1969, 44/79,534; July 28, 1970, 45/65,858

Int. Cl. G03f 7/02

U.S. Cl. 96—33 10 Claims

ABSTRACT OF THE DISCLOSURE

There is provided, a method for preparing a lithographic printing plate, which comprises (1) hydrolyzing the surface of a sheet consisting essentially of an oleophilic cellulose organic acid ester to render the surface thereof hydrophilic, (2) impregnating a nucleus material for use in a silver diffusion transfer process into the hydrophilic surface of said sheet, (3) forming a silver image in the hydrophilic surface of said sheet through a silver diffusion transfer process, and (4) removing the silver image-bearing portion of the hydrophilic surface of said sheet by treating said surface of said sheet with an aqueous etching solution containing hydrogen peroxide, whereby the oleophilic body of said cellulose organic ester sheet is exposed in those areas corresponding to the image-containing areas.

BACKGROUND OF THE INVENTION

Field of the invention

This invention relates to a method for preparing a lithographic printing plate. More particularly it relates to a method for preparing a lithographic printing plate by forming silver images in a hydrophilic surface portion of an oleophilic support and removing the hydrophilic surface portion in conformity with the silver images to expose the oleophilic support.

Description of the prior art

In general, a lithographic printing plate is composed of oleophilic ink-receptive areas forming image areas and hydrophilic areas forming non-image or background areas. For preparing such a printing plate, a method is known in which image areas of an oleophilic surface of a support are converted into the oleophilic state, while another method comprises applying a hyrdophilic layer to the surface of an oleophilic material and then removing the hydrophilic layer only at the image areas to expose the oleophilic surface.

For example, in U.S. Pat. No. 2,448,861, there is described a method of preparing a printing plate by providing hydrophilic properties to the surface of a cellulose ester sheet, photosensitizing the hydrophilic layer with a bichromate compound, image-exposing the photosensitive layer, and subjecting the thus-exposed layer to an etching treatment with an aqueous solution of zinc chloride or sodium hypochlorite to selectively remove the hydrophilic non-image areas or image areas respectively, whereby the oleophilic surface of the cellulose ester sheet is exposed at these areas.

Also, in British Pat. No. 1,129,366, there is described a method of preparing a printing plate by applying a hydrophilic layer containing nucleous material for a diffusion transfer process to a support having an oleophilic surface, forming silver images on the hydrophilic layer by a development for a diffusion transfer process, and removing the hydrophilic layer at the corresponding areas by utilizing the silver images to expose the oleophilic surface of the support at these areas.

Furthermore, in U.S. Pat. No. 3,385,701, there is disclosed a method of preparing a printing plate by applying a hydrophilic layer containing nucleus material for a diffusion transfer process to the surface of an oleophilic support, conducting a diffusion transfer development by contacting the hydrophilic layer with a negative material exposed to form silver images on the hydrophilic layer, and removing the hydrophilic layer at the corresponding areas utilizing the silver images to expose the oleophilic support at these areas.

However, in the method disclosed in U.S. Pat. No. 2,448,861 mentioned above, a bichromate is used as the light-sensitive material and accordingly the light-sensitive region is in the ultraviolet region and the photosensitivity is low. Further, the photosensitized sheet is inferior in stability or preservability. On the other hand, in the method disclosed in British Pat. No. 1,129,366 or U.S. Pat. No. 3,385,701, the printing plate is prepared by applying a hydrophilic layer to the surface of an oleophilic support. Accordingly, the adherence between the surface of the support and the hydrophilic layer is insufficient and it frequently happens that the hydrophilic layer at the non-image areas is stripped at printing and an oily ink is attached to the oleophilic thus-exposed support by stripping to cause stains on the prints. Moreover, since such a hydrophilic layer used in such methods is composed of gelatin, colloidal silica, etc., the hydrophilic property thereof is not always sufficient and as the number of prints increases, an oily ink is gradually apt to attach to the non-image areas of the hydrophilic surface, whereby stains are formed on the prints. Therefore, in such methods it is difficult to obtain a large number of prints having good quality or images.

A main object of the present invention is, therefore, to provide a method for preparing an improved lithographic printing plate without having the above-mentioned faults of conventional lithographic printing plates.

Another object of this invention is to provide a method of preparing a lithographic printing plate capable of providing a large number of good prints by a simple procedure using a plate capable of being converted into a lithographic printing plate.

A further object of this invention is to provide an improved lithographic printing plate capable of providing a larger number of good prints.

SUMMARY OF THE INVENTION

The above objects of this invention are attained by hydrolyzing the surface of a sheet of a cellulose organic acid ester to provide a hydrophilic property to the surface thereof, forming a silver image in the hydrophilic surface portion of the sheet, and removing the hydrophilic surface portion in conformity with the silver image to expose the oleophilic portion of the cellulose ester sheet.

DESCRIPTION OF THE PREFERRED EMBODIMENTS

According to the method of the present invention, an improved lithographic printing plate is prepared by forming a silver image in a hydrophilic surface portion of a cellulose organic acid ester sheet by a diffusion transfer process, said surface portion containing nucleus material for the diffusion transfer process, and then removing the silver image-bearing portion of the hydrophilic surface by processing the portion in an aqueous solution containing hydrogen peroxide to expose the oleophilic surface of the cellulose organic acid ester sheet at the image portion.

The printing plate prepared by the method of this invention does not have the disadvantage that the hydrophilic portion is stripped when a larger number of prints are prepared using the printing plate.

Although we do not wish to be limited to the following description, it is believed that the hydrolyzed portion of a sheet made of an organic acid ester of cellulose, which is expressed by the term "hydrophilic surface portion" in the present specification, has a degree of hydrophilicity decreasing progressively towards the inside of the sheet with the surface being most hydrophilic. In other words, the degree of hydrophilicity of the hydrolized cellulose ester sheet is not uniform with respect to the direction of thickness of the sheet. The hydrophilicity of the sheet decreases progressively, until the sheet loses hydrophilicity and has an inherent oleophilic property. Therefore, in the lithographic printing plate of this invention, there is no clear boundary between the oleophilic portion of the sheet and the hydrophilic portion thereof as is present in the aforesaid known printing plates prepared by applying a hydrophilic material to the surface of an oleophilic sheet.

This understanding might be supported by the fact that the image portion of the plate prepared by the method of this invention is slightly less oleophilic than a fresh surface of a cellulose organic acid ester sheet.

Figure 1:
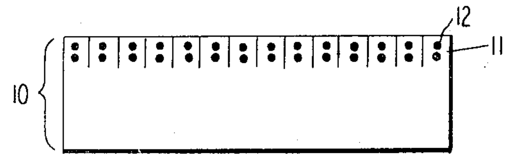
FIGS. 1–3 and 4–7, respectively, represent two embodiments of methods used to produce lithographic printing plates according to the present invention.
Figure 2:
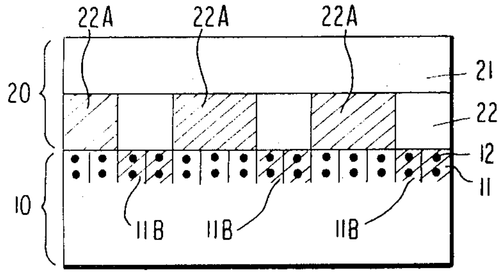
Figure 3:
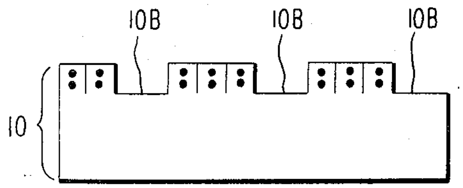

One particular embodiment of the method of the present invention will be illustrated by referring to FIGS. 1–3 of the accompanying drawings, in which:

FIG. 1 is a schematic cross-sectional view showing an embodiment of the lithographic printing plate material used to prepare a lithographic printing plate by the method of the present invention.

FIG. 2 and FIG. 3 are schematic cross-sectional views of the printing plate material during the main steps of producing a lithographic printing plate by the method of this invention.

Referring to FIG. 1, a sheet 10 of a cellulose organic acid ester has a hydrophilic surface portion 11 containing nucleus material 12 for the diffusion transfer process. This printing plate material is superposed on an image-exposed sensitive material, and developed with a diffusion transfer developing solution. This arrangement is shown in FIG. 2.

The sensitive photographic material may be any ordinary sensitive material consisting of a support such as paper or a synthetic resin film and a light-sensitive silver halide emulsion layer formed thereon. As the silver halide emulsion, a gelatin-silver chloride emulsion and a gelatin-silver chlorobromide emulsion are preferred. Exposure is imparted from an original design by contact, projection or reflection to form a negative latent image of the original design on the light-sensitive material. The diffusion transfer developing solution is the developing solution usually used in a diffusion transfer process and contains a solvent for the silver halide together with a developing agent.

Referring now to FIG. 2, a sensitive material 20 has a light-sensitive silver halide emulsion layer 22 on a support 21. A negative silver image of the original is formed on portion 22A by the reduction of exposed silver halide. A silver image is also formed at portion 11B in a hydrophilic surface portion 11 of sheet 10. This is because silver halide complex salt diffuses from the unexposed part of the emulsion layer 22 to portion 11B in the hydrophilic surface portion 11 by the action of a solvent for the silver halide such as sodium thiosulfate which is contained in the diffusion transfer developing solution, and is reduced with the developing solution at the sites of nucleus material 12 present in surface portion 11B. This image is a positive image with respect to the original. The diffusion transfer development can be effected by an ordinary procedure. After completion of the development, the printing plate material is separated from the negative material. In the present invention, the separation of the printing plate material from the negative material can be accomplished very well.

The printing plate material is then treated with an etching solution containing hydrogen peroxide and an oxidizing agent, whereby those parts of the hydrophilic surface portion 11B which contain the silver image are etched, and are ready for removal. It is well known that the etching solution contains an oxidizing agent for the silver image such as a cupric salt, an acid or a bromide which serves to promote the etching action. By rubbing the surface of the etched sheet material lightly, the image areas of the hydrophilic surface portion 11B are removed, and then the oleophilic body 10B of the cellulose ester sheet 10 appears. The non-image areas of the hydrophilic surface layer remain unremoved. This arrangement is illustrated in FIG. 3.

The printing plate so produced may be used in customary methods of direct or offset lithography. More than 10,000 printed copies or impressions of good quality can be produced stably on the printing plate of this invention using commercially available ink and fountain solutions.

Figure 4:
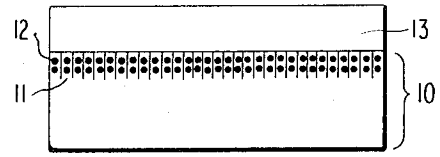
Figure 5:
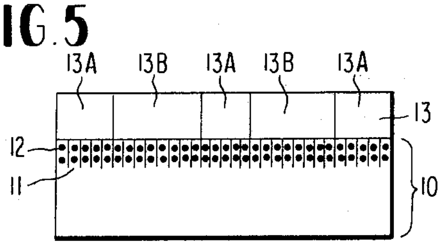
Figure 6:
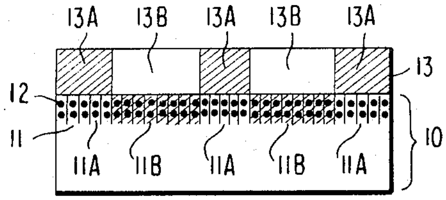
Figure 7:
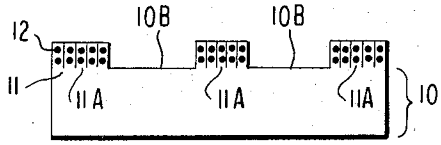

Another embodiment of the present invention is illustrated by referring to FIGS. 4–7 of the accompanying drawings, in which:

FIG. 4 is a schematic cross-sectional view showing an embodiment of the light-sensitive sheet used to prepare a lithographic printing plate by the method of this invention, and FIGS. 5 to 7 show schematic cross-sectional views of the light-sensitive sheet during the steps of producing a lithographic printing plate by the method of this invention.

In FIG. 4 a sheet 10 of a cellulose organic acid ester has a hydrophilic surface portion 11 containing nucleus material 12 for the diffusion transfer process and to the surface of the hydrophilic surface portion 11 has been applied a light-sensitive silver halide photographic emulsion layer 13.

As the light-sensitive silver halide emulsion layer, any photographic silver halide emulsion usually used in photographic processes may be used. In particular, a gelatino silver chlorobromide emulsion usually used for preparing a light-sensitive element for printing plates is suitably used. Silver chlorobromide is also preferable in a diffusion transfer development process. The silver halide photographic emulsion used in this invention is generally orthochromatic but in the case of forming color prints from a colored original, a silver halide emulsion which is panchromatically sensitized is used.

In FIG. 5 is shown the light-sensitive sheet which was exposed through an original. The part 13A of the emulsion layer 13 represents the exposed part, that is, the portion corresponding to the non-image part of the original and part 13B represents the non-exposed part or the part corresponding to the image area of the original.

As the original, not only a line copy but also a screen dot image may be used. Furthermore, the light-sensitive element of this invention may be exposed through a continuous tone original using a screen.

If the original is a positive original, a positive print is obtained. The exposure may be conducted by contact printing or by an enlargement process.

The thus-exposed light-sensitive sheet is then subjected to diffusion transfer development. The developer is a conventional diffusion transfer developer and contains a solvent for the silver halide together with a developing agent.

In FIG. 6 is shown the sheet after being processed in the diffusion transfer developer. In part 13A, corresponding to the exposed part of the silver halide emulsion layer 13, is formed a silver image. The silver image part 13A is a negative image of the original. On the other hand, a silver image is formed in part 11B in hydrophilic surface portion 11. The silver image 11B is formed by the diffusion of a complex salt of silver halide in the unexposed part 13B into the hydrophilic surface part 11B by the solvent for the silver halide, where the complex salt is reduced to metallic silver by the developing agent at the nucleus material contained in the hydrophilic surface portion. The silver image 11B is a positive image with respect to the original.

The sheet thus-developed is treated with warm water to remove the silver halide emulsion layer 13. This step of removing the emulsion layer 13 is not always necessary but is desirable for preventing the hydrophilic surface part 11A from being subjected to an undesirable etching action by the silver image of the part 13A in the subsequent etching step.

Thereafter, the sheet is processed in an etching solution containing hydrogen peroxide. By this processing, the hydrophilic surface part 11B containing the silver image is etched and becomes readily removable.

By softly rubbing the surface of the sheet thus subjected to the etching treatment, the hydrophilic portion 11B is removed and the oleophilic body 10B of the cellulose sheet 10 is exposed. On the other hand, the hydrophilic surface part 11A is left. The state of the sheet thus obtained is shown in FIG. 7.

The prepared lithographic printing plate may be used directly or as an offset printing plate. By using the printing plate thus prepared by the method of this invention more than 10,000 sheets of good prints can be obtained using commercially available ink and fountain solutions.

As the cellulose organic acid ester used for the light-sensitive sheet in the present invention, there may be illustrated cellulose acetate, cellulose propionate, cellulose-butyrate, cellulose acetate butyrate, and the like. The surface of the sheet of such a cellulose ester is oleophilic but becomes hydrophilic by hydrolyzing with an aqueous solution of a caustic alkali such as potassium hydroxide containing, if necessary, a polar organic solvent such as methyl alcohol, ethyl alcohol, ethylene glycol, etc.

The hydrophilic surface portion contains nucleus material, for a diffusion transfer process. As the nucleus material, there may be employed a substance ordinarily used in diffusion transfer processes, for instance, colloidal heavy metals such as colloidal silver and sulfur compounds of heavy metals such as silver sulfide, nickel sulfide, etc. The nucleus material may be incorporated in the hydrophilic surface portion after hydrolyzing the sheet of the cellulose ester or it may be preliminarily incorporated in the sheet during the production of the sheet and thereafter the sheet may be hydrolyzed.

When the dimensional stability or mechanical strength is required for the sheet of the cellulose organic acid ester in the present invention, it is preferable to back the sheet with a polyethylene terephthalate film or a metallic plate such as an aluminum plate.

For example, a sheet prepared by under-coating a polyethylene terephthalate film and applying to the undercoated layer a layer of the cellulose organic acid ester may be used.

According to the method of this invention, positive prints can be obtained from a positive original and a lithographic printing plate can be directly prepared by a simple procedure.

Also, in the printing plate of this invention, the hydrophilic surface portion and the oleophilic portion of the sheet are originally composed of the same material (i.e., the former is formed by treating the surface portion of the latter), and hence the hydrophilic portion of the sheet is not stripped from the oleophilic portion during printing, as is the case with conventional printing plates prepared by applying a hydrophilic layer to the surface of an oleophilic support, and also a large number of good prints can be obtained from the lithographic printing plate prepared by the method of this invention. Moreover, by providing panchromatic color sensitivity to the silver halide emulsion for the light-sensitive element, a printing plate for color printing can be directly prepared from a colored original without the necessity of making trichromatic films.

The present invention will be further illustrated by reference to the following non-limiting examples.

EXAMPLE 1

A cellulose triacetate film having a thickness of 135μ was immersed in a 1 N solution of sodium hydroxide at 50° C. for 15 minutes to hydrolyze the surface thereof and thus render the surface hydrophilic. The treated film was then immersed in a 0.1 mole aqueous solution of sodium sulfide at 25° C. for one minute. The film was squeezed to remove the solution on the surface, and then immersed in a 0.1 mole aqueous solution of nickel chloride at 25° C. for 3 minutes, followed by washing with water and drying. There was produced a printing plate material containing in its hydrophilic surface portion nickel sulfide as a nucleating substance for the diffusion transfer process.

A silver halide light-sensitive material exposed through a positive original was superposed on the resulting printing plate material in the presence of a developing solution of the following formulation at 25° C. for 30 seconds.

| | G. |
|---|---|
| P-methylaminophenol sulfate | 5 |
| Anhydrous sodium sulifite | 65 |
| Hydroquinone | 15 |
| Anhydrous sodium thiosulfate | 15 |
| Sodium hydroxide | 20 |
| Water to make, 1 liter. | |

The negative material was peeled off, and after washing with water, the printing plate material was immersed in an etching solution consisting of equal amounts of solutions Ia and II of the following formuation at 25° C. for 30 seconds.

Solution Ia:

| | | |
|---|---|---|
| Cupric chloride (dihydrate) | g | 10 |
| Citric acid | g | 10 |
| Water to make, 1 liter. | | |

Solution II:

Hydrogen peroxide as a 3% aqueous solution.

By this treatment, a positive silver image of the original formed in the hydrophilic surface portion of the cellulose sheet was bleached and etched simultaneously. The surface was lightly rubbed with cotton cloth. The silver image areas of the hydrophilic surface layer were removed, and the oleophilic surface of the cellulose triacetate film was uncovered.

When the resulting printing plate was mounted on an ordinary offset printing press and printing was effected using a commercially available ink and dampening water, more than 10,000 impressions of good quality were obtained.

EXAMPLE 2

A cellulose triacetate film having a thickness of 135μ was immersed in a solution of the following formulation at 20° C. for 3 minutes.

| | | |
|---|---|---|
| Sodium hydroxide | g | 50 |
| Ethyl alcohol | ml | 500 |
| Water | ml | 500 |

The treated film was then immersed in a 0.1 mole aqueous solution of sodium sulfide at 25° C. for 2 minutes. The film was squeezed to remove the solution on the surface, and then immersed in a 0.1 mole aqueous solution of silver nitrate at 25° C. for 3 minutes, followed by washing with water and drying. There was produced a printing plate material containing nuclei of silver sulfide in the hydrophilic surface layer. Thereafter, the material was treated in the same manner as set forth in Example 1 using an etching solution consisting of equal amounts of solution Ib and solution II of the following formulations.

Solution Ib:

| | | |
|---|---|---|
| Cupric sulfate (pentahydrate) | g | 120 |
| Citric acid | g | 170 |
| Potassium bromide | g | 10 |
| Water to make, 1 liter. | | |

Solution II:

Hydrogen peroxide as a 3% aqueous solution.

Using the printing plate obtained, printing was done in accordance with the same procedure as set forth in Example 1, and printed matter of good quality was obtained.

EXAMPLE 3

An undercoat was applied to a polyethylene terephthalate film having a thickness of 135μ, and a cellulose triacetate layer having a thickness of 10μ was formed thereon. Using the printing plate material so produced, the procedure of Example 1 was repeated. Printed matter of good quality was obtained.

EXAMPLE 4

An undercoat was applied to a polyethylene terephthalate film having a thickness of 135μ, and cellulose triacetate having dispersed therein silver sulfide was coated on the undercoat layer to a thickness of 8μ. Using the printing plate material so produced, the procedure of Example 1 was repeated. Printed matter of good quality was obtained.

EXAMPLE 5

The procedure of Example 3 was repeated except that cellulose acetate butyrate (Type 161–40, product of Eastman Kodak Company) was used instead of the cellulose triacetate. Printed matter of good quality was obtained.

EXAMPLE 6

A 5% methylene chloride solution of a copolymer composed of 75% vinyl chloride, 24% vinyl acetate and 1% maleic anhydride was coated onto an aluminum plate having a thickness of 150μ, and dried. A solution consisting of 9 parts by weight cellulose triacetate, 75 parts by weight methylene chloride, 5 parts by weight isopropanol and 11 parts by weight ethylene chloride was further coated thereon to a thickness of 15μ. Using the printing plate material so produced, the procedure of Example 1 was repeated. Printed matter of good quality was obtained.

EXAMPLE 7

A 35μ thick layer of cellulose triacetate was superposed on top of high quality paper having a thickness of 150μ using an adhesive, and a polyethylene film was laminated on the back of the paper. Using the printing plate material so produced, the procedure of Example 1 was repeated. Printed matter of good quality was obtained.

EXAMPLE 8

The same film sheet and treatment was used as in Example 1. A film sheet having a hydrophilic surface portion containing nickel sulfide as a nucleus material for the diffusion transfer process was obtained. The sheet was coated with a silver chlorobromide emulsion containing 1 mole of silver per one kg. of emulsion to a thickness of 3 microns (70% silver chloride).

After exposing the light-sensitive film through an original, the film was developed for 30 seconds at 25° C. in the developer described in Example 1. Thereafter, the developed film was immersed in warm water of 45° C. to remove the emulsion layer and then immersed for 30 seconds at 25° C. in the etching solution described in Example 1.

By this treatment, the positive silver image of the original was bleached and the image parts were etched. Then, the surface of the film was softly rubbed by a cotton cloth. the hydrophilic surface parts bearing silver image were removed and the oleophilic surface of the triacetyl cellulose body were exposed at these portions.

The printing plate thus prepared was mounted on an offset printing machine and printing was conducted using a commercially available ink and dampening water, whereby more than 10,000 sheets of stable and good prints were obtained.

EXAMPLE 9

The same film sheet and treatment was used as in Example 2. A sheet having a hydrophilic surface portion containing silver sulfide as a nucleus material was obtained.

The same procedure as in Example 8 was followed by using the sheet thus prepared, in which, however, the etching solution described in Example 2 was used. Good prints as in Example 2 were obtained.

EXAMPLE 10

When the same procedure as in Example 8 was followed using a sheet prepared by applying a layer of triacetyl cellulose of 10 microns thickness to an under-coated polyethylene terephthalate film having a thickness of 135 microns, good prints were obtained.

EXAMPLE 11

To an aluminum plate having a thickness of 150 microns was applied a 5% ethylene chloride solution of a copolymer consisting of 75% vinyl chloride, 24% vinyl acetate, and 1% maleic anhydride and the layer was dried. To the layer thus formed was applied a solution consisting of 9 parts by weight triacetyl cellulose, 75 parts by weight methylene chloride, 5 parts by weight isopropanol, and 11 parts by weight ethylene chloride to a thickness of 15 microns.

By following the same procedure as in Example 8 using the sheet thus prepared, good prints were obtained.

What is claimed is:

1. A method for preparing a lithographic printing plate, which comprises:

(1) hydrolyzing the surface of a sheet consisting essentially of an oleophilic cellulose organic acid ester to render the surface thereof hydrophilic, (2) impregnating a nucleus material for use in a silver diffusion transfer process into the hydrophilic surface of said sheet, (3) forming a silver image in the hydrophilic surface of said sheet through a silver diffusion transfer process, and (4) removing the silver image-bearing portion of the hydrophilic surface of said sheet by treating the surface of said sheet with an aqueous etching solution containing hydrogen peroxide, whereby the oleophilic body of said cellulose organic ester sheet is exposed in those areas corresponding to the image-containing areas.

2. A method according to claim 1 wherein said etching solution further contains a cupric salt and an acid.

3. The lithographic printing plate made by the method of claim 1.

4. The method of claim 1, wherein the forming of said silver image in Step (3) is carried out by contacting said hydrophilic surface of said surface impregnated sheet with an image-exposed light-sensitive silver halide photographic emulsion in the presence of a diffusion transfer developing solution.

5. The method of claim 1, wherein the forming of said silver image in Step (3) is carried out by applying a silver halide emulsion to said hydrophilic surface, and forming a reversal silver image of said original image in said hydrophilic surface of said sheet.

6. The method of claim 1 wherein the impregnating of said nucleus material in Step (2) is carried out by contacting said surface hydrolyzed sheet with a liquid medium containing colloidal particles of said nucleus material.

7. The method of claim 1 wherein the impregnating of said nucleus material in Step (2) is carried out by contacting said surface hydrolyzed sheet with a solution of an alkali metal sulfide and subsequently, contacting said solution treated surface hydrolyzed sheet with a solution of a heavy metal salt.

8. The method of claim 7, wherein said solution of an alkali metal sulfide is a solution of sodium sulfide.

9. The method of claim 7, wherein said metal salt is silver nitrate.

10. The method of claim 7, wherein said metal salt is nickel chloride.

References Cited

UNITED STATES PATENTS

| | | | |
|---|---|---|---|
| 2,484,431 | 10/1949 | Staehle et al. | 96—33 |
| 2,448,861 | 9/1948 | Colt | 96—33 |
| 2,568,503 | 9/1951 | Kenyon et al. | 96—33 |
| 2,548,537 | 4/1951 | Kenyon et al. | 96—33 |
| 3,385,701 | 5/1968 | Ormsbee et al. | 96—29 L |
| 3,015,562 | 1/1962 | Herrick et al. | 96—33 |
| 3,552,970 | 1/1971 | Ormsbee | 96—29 L |

FOREIGN PATENTS

| | | |
|---|---|---|
| 1,129,366 | 10/1968 | Great Britain. |
| 1,149,921 | 4/1969 | Great Britain. |

RONALD H. SMITH, Primary Examiner

E. C. KIMLIN, Assistant Examiner

U.S. Cl. X.R.

96—29 L; 101—460, 463